(12) United States Patent
Lehman et al.

(10) Patent No.: US 9,998,140 B2
(45) Date of Patent: Jun. 12, 2018

(54) MATCHING PATTERN COMBINATIONS VIA FAST ARRAY COMPARISON

(71) Applicant: International Business Machines Corporation, Armonk, NY (US)

(72) Inventors: Tobin J. Lehman, Cupertino, CA (US); Mario H. Lichtsinn, San Jose, CA (US); Hovey R. Strong, Jr., San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 711 days.

(21) Appl. No.: 13/867,596

(22) Filed: Apr. 22, 2013

(65) Prior Publication Data

US 2014/0317161 A1    Oct. 23, 2014

(51) Int. Cl.
  *H03M 7/14*    (2006.01)
  *H03M 7/30*    (2006.01)
  *H03H 7/30*    (2006.01)

(52) U.S. Cl.
  CPC ............... *H03M 7/14* (2013.01); *H03H 7/30* (2013.01)

(58) Field of Classification Search
  CPC ................................... H03M 7/14; H03M 7/30
  See application file for complete search history.

(56) References Cited

U.S. PATENT DOCUMENTS

| | | |
|---|---|---|
| 5,343,554 A | 8/1994 | Koza et al. |
| 5,555,323 A | 9/1996 | Hongu |
| 5,951,623 A | 9/1999 | Reynar et al. |
| 6,098,034 A | 8/2000 | Razin et al. |
| 6,892,367 B2 | 5/2005 | Palusinski et al. |
| 7,099,493 B2 | 8/2006 | Muratani |
| 7,877,401 B1* | 1/2011 | Hostetter et al. ............. 707/758 |
| 7,912,805 B2 | 3/2011 | Brown et al. |
| 8,108,848 B2 | 1/2012 | Meijer et al. |
| 2003/0138159 A1* | 7/2003 | Fryer et al. .................... 382/253 |
| 2005/0149590 A1 | 7/2005 | Lee et al. |
| 2006/0010151 A1* | 1/2006 | Star Sung ...................... 707/102 |
| 2010/0164800 A1* | 7/2010 | Onda ........................ 342/357.15 |
| 2010/0169758 A1 | 7/2010 | Thomsen |

* cited by examiner

*Primary Examiner* — Chuong D Ngo

(74) *Attorney, Agent, or Firm* — Ference & Associates LLC

(57) ABSTRACT

Methods and arrangements for providing a compressed representation of a number sequence. An input number sequence is received, as is a stored number sequence. The input number sequence is compared to the stored number sequence. The comparing includes determining a set of coefficients corresponding to the input number sequence, via solving at least one algebraic equation, the at least one algebraic equation comprising at least one of: an arithmetic equation, and an exponential equation. The comparing further includes applying at least one test to determine whether the set of coefficients identifies at least a portion of the stored number sequence as matching the entire input number sequence.

21 Claims, 3 Drawing Sheets

MATCHING PATTERN COMBINATIONS VIA FAST ARRAY COMPARISON

BACKGROUND

It is often desirable, even necessary, to find a succinct or compressed representation for an input sequence of numbers, especially given an input of a very large quantity of numbers. One commonly encountered context for such a problem is with predictive cost functions, which often are presented as a very large array of numbers.

To the extent that there has been some exploration of using a simple combination of library functions for such succinct or compressed representations, an extra benefit arises when a decomposition into the simple library functions yields a suggestion of a candidate simplification of the set of formulas used to compute the predictive cost functions. However, major problems continue to be met when potentially hundreds of millions of such predictive cost functions need to be stored in a general data repository for a given practical use, such as in general analysis and in profitability forecasting.

BRIEF SUMMARY

In summary, one aspect of the invention provides a method of providing a compressed representation of a number sequence, the method comprising: utilizing a processor to execute computer code configured to perform the steps of: receiving an input number sequence; determining a set of coefficients describing the input number sequence; accessing a library of stored number sequences, wherein the library includes a representation of stored number sequences; and using the set of coefficients to match a representation of the stored number sequences of the library.

Another aspect of the invention provides an apparatus providing a compressed representation of a number sequence, the apparatus comprising: at least one processor; and a computer readable storage medium having computer readable program code embodied therewith and executable by the at least one processor, the computer readable program code comprising: computer readable program code configured to receive an input number sequence; computer readable program code configured to determine a set of coefficients describing the input number sequence; computer readable program code configured to access a library of stored number sequences, wherein the library includes a representation of stored number sequences; and computer readable program code configured to use the set of coefficients to match a representation of the stored number sequences of the library.

An additional aspect of the invention provides a computer program product for providing a compressed representation of a number sequence, the computer program product comprising: a computer readable storage medium having computer readable program code embodied therewith, the computer readable program code comprising: computer readable program code configured to receive an input number sequence; computer readable program code configured to determine a set of coefficients describing the input number sequence; computer readable program code configured to access a library of stored number sequences, wherein the library includes a representation of stored number sequences; and computer readable program code configured to use the set of coefficients to match a representation of the stored number sequences of the library.

A further aspect of the invention provides a method comprising: utilizing a processor to execute computer code configured to perform the steps of: receiving an input number sequence; receiving a stored number sequence; and comparing the input number sequence to the stored number sequence; the comparing comprising: determining a set of coefficients corresponding to the input number sequence, via solving at least one algebraic equation, the at least one algebraic equation comprising at least one of: an arithmetic equation, and an exponential equation; and applying at least one test to determine whether the set of coefficients identifies at least a portion of the stored number sequence as matching the entire input number sequence.

For a better understanding of exemplary embodiments of the invention, together with other and further features and advantages thereof, reference is made to the following description, taken in conjunction with the accompanying drawings, and the scope of the claimed embodiments of the invention will be pointed out in the appended claims.

DETAILED DESCRIPTION

Figure 1:
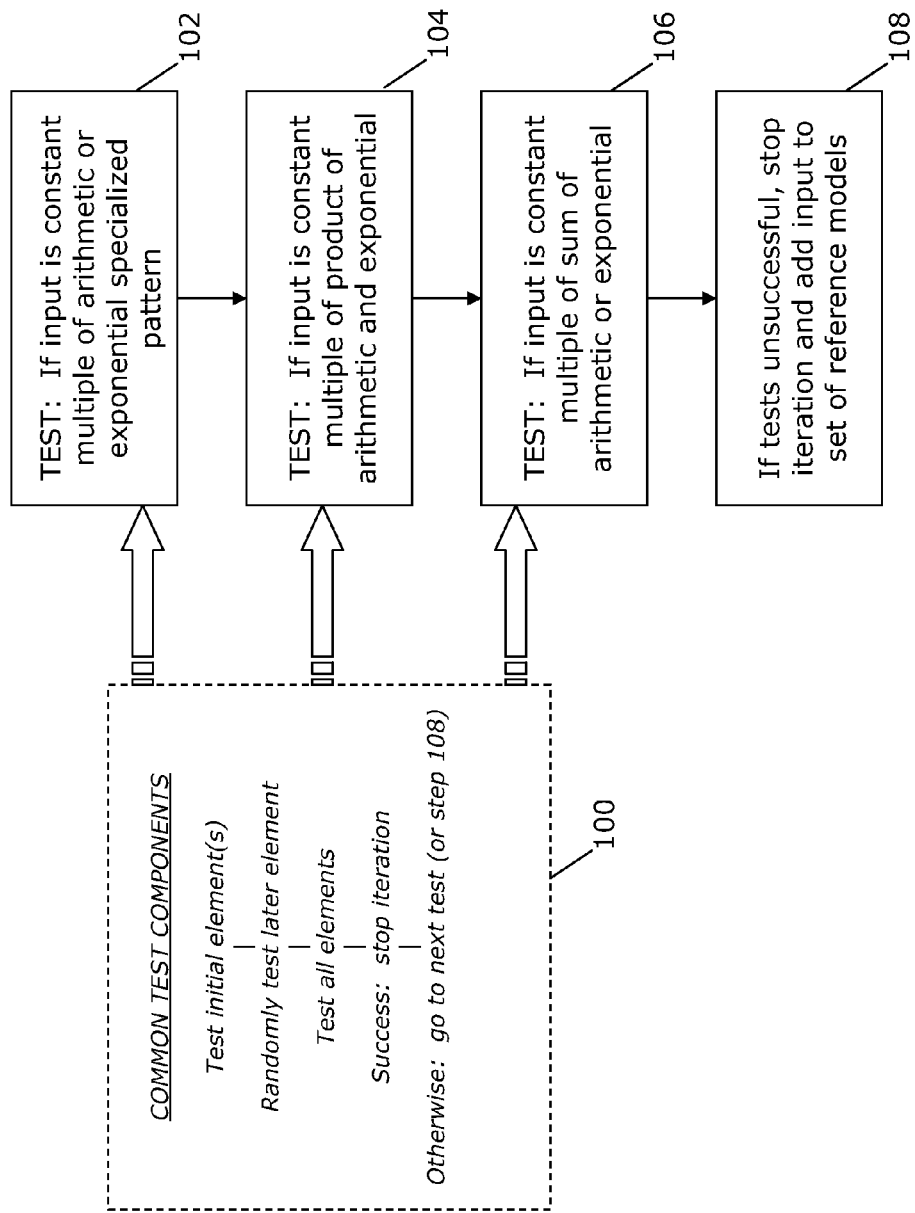
FIG. 1 schematically illustrates a process of testing an input number sequence against stored sequences.

It will be readily understood that the components of the embodiments of the invention, as generally described and illustrated in the figures herein, may be arranged and designed in a wide variety of different configurations in addition to the described exemplary embodiments. Thus, the following more detailed description of the embodiments of the invention, as represented in the figures, is not intended to limit the scope of the embodiments of the invention, as claimed, but is merely representative of exemplary embodiments of the invention.

Reference throughout this specification to "one embodiment" or "an embodiment" (or the like) means that a particular feature, structure, or characteristic described in connection with the embodiment is included in at least one embodiment of the invention. Thus, appearances of the phrases "in one embodiment" or "in an embodiment" or the like in various places throughout this specification are not necessarily all referring to the same embodiment.

Furthermore, the described features, structures, or characteristics may be combined in any suitable manner in at least one embodiment. In the following description, numerous specific details are provided to give a thorough understanding of embodiments of the invention. One skilled in the relevant art may well recognize, however, that embodiments of the invention can be practiced without at least one of the specific details thereof, or can be practiced with other methods, components, materials, et cetera. In other instances, well-known structures, materials, or operations are not shown or described in detail to avoid obscuring aspects of the invention.

The description now turns to the figures. The illustrated embodiments of the invention will be best understood by reference to the figures. The following description is intended only by way of example and simply illustrates certain selected exemplary embodiments of the invention as claimed herein.

It should be noted that the flowchart and block diagrams in the figures illustrate the architecture, functionality, and operation of possible implementations of systems, apparatuses, methods and computer program products according to various embodiments of the invention. In this regard, each block in the flowchart or block diagrams may represent a module, segment, or portion of code, which comprises at least one executable instruction for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Specific reference will now be made herebelow to FIG. 1. It should be appreciated that the processes, arrangements and products broadly illustrated therein can be carried out on, or in accordance with, essentially any suitable computer system or set of computer systems, which may, by way of an illustrative and non-restrictive example, include a system or server such as that indicated at 12' in FIG. 3. In accordance with an example embodiment, most if not all of the process steps, components and outputs discussed with respect to FIG. 1 can be performed or utilized by way of a processing unit or units and system memory such as those indicated, respectively, at 16' and 28' in FIG. 3, whether on a server computer, a client computer, a node computer in a distributed network, or any combination thereof.

An illustrative context of at least one embodiment of the invention is in the realm of long duration service delivery contracts. Atomic services to be delivered in that connection can be organized on the basis of decisions that pertain to characteristics of the service client, characteristics of the delivery source, and characteristics of the atomic service itself. Likewise, a predictive cost model for an atomic service can be viewed as a combination of patterns, each pattern being a function of characteristics from one part of a decomposition of input into simple library functions.

Generally, in the context of at least one embodiment of the invention, a "pattern" is embodied by a sequence of numbers, and has as many elements as the number of units of time encompassed in the duration of delivery of a service. For example, the duration of a particular atomic service might be 60 months. A pattern for this atomic service would thus be a sequence of 60 numbers, which can be represented as doubles in the form of a "double array".

In accordance with at least one embodiment of the invention, an example of an atomic service would be a service involving remotely delivered IT (information technology) labor based on a volume of simple transactions. An estimator of cost for this service would involve an estimate of client related costs based on a predicted pattern of work volume. Further, a labor component of estimated costs would be based on a predicted pattern of increasing productivity corresponding to a learning curve. Also, costs related to delivery source would be based on a predicted pattern of inflation, overhead, and other related parameters. Finally, the general cost of service delivery could be estimated as the product of three patterns: work volume, productivity, and inflation. As employed in accordance with at least one embodiment of the invention, a standard predictive cost function is a pattern that can be decomposed into a constant multiple of a sum or product of specialized cost patterns, where a specialized cost patterns are chosen from a finite library of pattern representatives such that none of the specialized cost patterns is a multiple of another. As such, over many contracts involving thousands of atomic services, hundreds of patterns may be used, producing millions of distinct predictive cost functions. However, if the patterns are partitioned into equivalence sets by linear (and/or log-linear) transformations, the numbers of frequently used equivalence sets will be very small, providing a succinct representation for linear transformations of their products. It can be noted here, then, that a small number of parameters will suffice to identify each element of an equivalence set.

In accordance with at least one embodiment of the invention, a method for solving a succinct representation problem includes reducing the number of patterns to be considered via partitioning. This may be undertaken via suitable appropriate equivalence transformations that may be linear and/or log-linear in nature. Further included is a fast method for finding a suitable combination of frequently used patterns to represent a particular standard predictive cost function, if such a combination exists.

In accordance with at least one embodiment of the invention, fast partitioning, in connection with a method such as that just described, includes at least two steps. First, a quick test for linear or log-linear transformation is used, involving two array positions to establish the nature of the possible linear transformation and one position to verify. To avoid any systematic bias, at least one of the three array positions is chosen at random. For example, to determine the coefficients of a possible linear or log linear equivalence, one may always choose the first and second positions of the arrays being tested for equivalence; but the position for testing the coefficients is then chosen at random from the remaining positions in the arrays. Full verification is then performed only if the initial test is passed.

In accordance with at least one embodiment of the invention, specialized patterns involve taking a set of stair-step arithmetic and exponential progressions over contiguous parts of the complete duration of a project or process. Each element of the library is thereby completely characterized by the following parameters (and can be understood and appreciated more fully from additional discussion further below):

c=def 0, if arithmetic; 1, if exponential
p=def number of periods in the duration of a stair step
q=def the end period of the first stair step relative to the beginning period of the pattern
d=def starting period
e=def ending period (wherein, outside the range from d to e, the pattern must have value 0; inside, it must have a positive value)
a=adder, if c=0; multiplier, if c=1

The starting amount for each element of the each library is assumed to be 1 because any other starting amount can be achieved by a constant multiple. The values of d and e will correspond to the position of the first positive value of the input and the position of the last positive value of the input, respectively. Statistics are maintained on the occurrences of combinations of values for p and q, while a set of models is maintained to serve as reference models for an array of patterns.

In accordance with at least one embodiment of the invention, given an input pattern that is not a linear or log-linear transformation of any of the reference models, and as illustrated schematically in FIG. 1, several steps, now to be described, are iterated through frequently occurring combinations of values of p and q (with instructions being given for p=q=1, and suitable adjustments made for other sets of values of p and q). In other words, without loss of generality and for purposes of discussion, it is assumed that p and q are both 1. Adaptations for other values of p and q can be configured in any manner deemed suitable. Generally, a common set of steps or components 100 is applied to each of three tests 102/104/106: a testing of one or more initial elements in a sequence, a random testing of a later element (i.e., an element later in the sequence), a testing of all elements and then either a stoppage of the iteration or a progression to the next test (or a final step 108). While tests 102, 104, and 106 are shown in FIG. 1 in that particular order, it should be understood that they may be performed in any order, e.g., in an order in which success may be determined to be most likely.

First, in accordance with at least one embodiment of the invention, a test (102) is made as to whether the input is a constant multiple of an arithmetic or exponential specialized pattern in the library. Accordingly, the value of s, the constant multiple is determined to correspond to the first element of the input pattern. The value of a (adder or multiplier) is determined from the first and second elements. The possibility of either "arithmetic" or "exponential" is checked with a random later element. If successful, all elements are tested to confirm, and if still successful, the iteration is stopped and the input is characterized and recorded by way of the aforementioned parameters c, d, e, s, and a (or alternatively, parameters c, d, e, p, q, s, and a). If unsuccessful, computation moves to the next test.

Next, in accordance with at least one embodiment of the invention, a test (104) is made as to whether the input is a constant multiple of a product of an arithmetic and an exponential (with the same p, d, and e) in the library. Accordingly, use the values of the first three positions of the input to determine the specific parameters c1=0, s1, a1, c2=1, s2=1, a2 as the solution to a set of three algebraic relationships that are at most quadratic in any variable. The solution is then tested on a random later position beyond the first three of the input. If successful, all elements are tested to confirm and, if still successful, the iteration is stopped, and the input is characterized and recorded as the product of two sets of the six parameters above. If unsuccessful computation moves to the next test. Then, in accordance with at least one embodiment of the invention, a test (106) is made as to whether the input is a constant multiple of a sum of an arithmetic and an exponential in the library. Accordingly, the first four elements of the input are used to determine the specific parameters c1=0, s1, a1, c2=1, s2, a2 as the solution to a set of four algebraic relationships that are at most cubic in any variable. The solution is tested on a random later element of the input and, if successful, all elements are tested to confirm. If still successful, the iteration is stopped and the input is characterized and recorded as the product of two sets of the six parameters above. Finally (108), if tests 102, 104 and 106 prove unsuccessful after a user specified number of combinations of p, d, and e, the iteration is stopped and the input is added to the set of reference models, a second library of patterns.

The disclosure now turns to an illustrative example of fast partitioning in accordance with at least one embodiment of the invention. While processes as broadly contemplated herein can work on very long patterns, the illustrative example uses short patterns for the sake of legibility. First, assume a reference set that has one pattern: <4, 1, 2, 3, 4, 5, 6>, and assume an input pattern <2,4,7,12,21,38,0>. A test is then made as to whether the input is a linear or log-linear transformation of the reference pattern. The test for log-linear represents a test as to whether the log of one of the patterns is a linear transformation of the other pattern. Thus, only the test for linear transformation between the two patterns is shown here inasmuch as the other tests are conducted similarly.

In accordance with at least one embodiment of the invention, the multiplier of the potential linear transformation from the reference pattern to the input pattern is determined to be $(4-2)/(1-4)=-(2/3)$. The adder is then determined to be $2+(2/3)4=14/3$. When applying the linear transformation to the fifth position of the reference pattern (with value 4), the result is the value 2, which is not 21 (i.e., the value of the fifth position of the input), and thus a failed test. The tests for log-linear likewise fail.

In accordance with at least one embodiment of the invention, there is next a test for a constant multiple of a first library pattern. The multiple s=2. If an arithmetic function, the adder would also be $4-2=2$. Choosing at random the fourth element, the value, 12, should in actuality be $2+3*2=8$, thus failing the random test. If an exponential progression, the multiplier would be $4/2=2$. Since value 12 of the (randomly chosen) fourth element does not correspond to $2*2*2*2=16$, the random test fails.

Next, in accordance with at least one embodiment of the invention, a test is made for a constant multiple of a product of an arithmetic library function and an exponential library function. The three guiding equations are:

$$s1*s2=2$$

$$(s1+a1)*(s2*a2)=4$$

$$(s1+2*a1)*(s2*a2*a2)=7$$

Since s2=1, there is yielded $$s1=2, (2+a1)*a2=4, \text{ and } (2+2*a1)*a2*a2=7.$$

Solving for a2, $$a2=4/(2+a1), \text{ and}$$

$$(2+a1)*16/(2+a1)(2+a1)=16/(2+a1)=7 \text{ or}$$

$$a1=2/7 \text{ and } a2=28/16=7/4.$$

It can be noted that the general solution to the three guiding equations has a closed form using square roots and rational functions, so they can be solved quickly. Testing in the fourth position, the test fails because there should actually be $$12=(2+3*(2/7))*(7/4)*(7/4)*(7/4)=(17*49)/64.$$

In accordance with at least one embodiment of the invention, a test is then made for a constant multiple of a sum of an arithmetic library function and an exponential library function. The four guiding equations are:

$$s1+s2=2$$

$$(s1+a1)+(s2*a2)=4$$

$$(s1+(2*a1))+(s2*a2*a2)=7$$

$$(s1+(3*a1))+(s2*a2*a2*a2)=12.$$

Substituting 2−s1 for s2, $$(s1+a1)+(2*a2)-(s1*a2)=4 \text{ or}$$

$$a1=12-s1-(2*a2)+(s1*a2)=(s1*(a2-1))+12-(2*a2).$$

Continuing to substitute, the guiding equations are solved with s1=1, a1=1, s2=1,a2=2. These values pass the test for every position between d=1 and e=6. Thus, the input can be represented as the sum of library functions as follows:

(in order $<c,p,q,d,e,s,a>$)

$<0,1,1,6,1,1>+<1,1,1,1,6,1,2>$.

It can be noted that the general solution to the four guiding equations has a closed form involving square roots, cube roots, and rational functions, so they can be solved quickly.

In accordance with at least one variant embodiment of the invention, the input represented as a constant multiple of a sum or product of an arithmetic library function and an exponential library function is added to the reference set, so other input patterns can be represented as linear or log-linear transformations. In fact, one could augment the reference set until checking for linear and log-linear equivalence takes longer than testing for representation over the library functions and then switch to checking for representation over the library functions first, and/or stop adding to the reference set.

Figure 2:
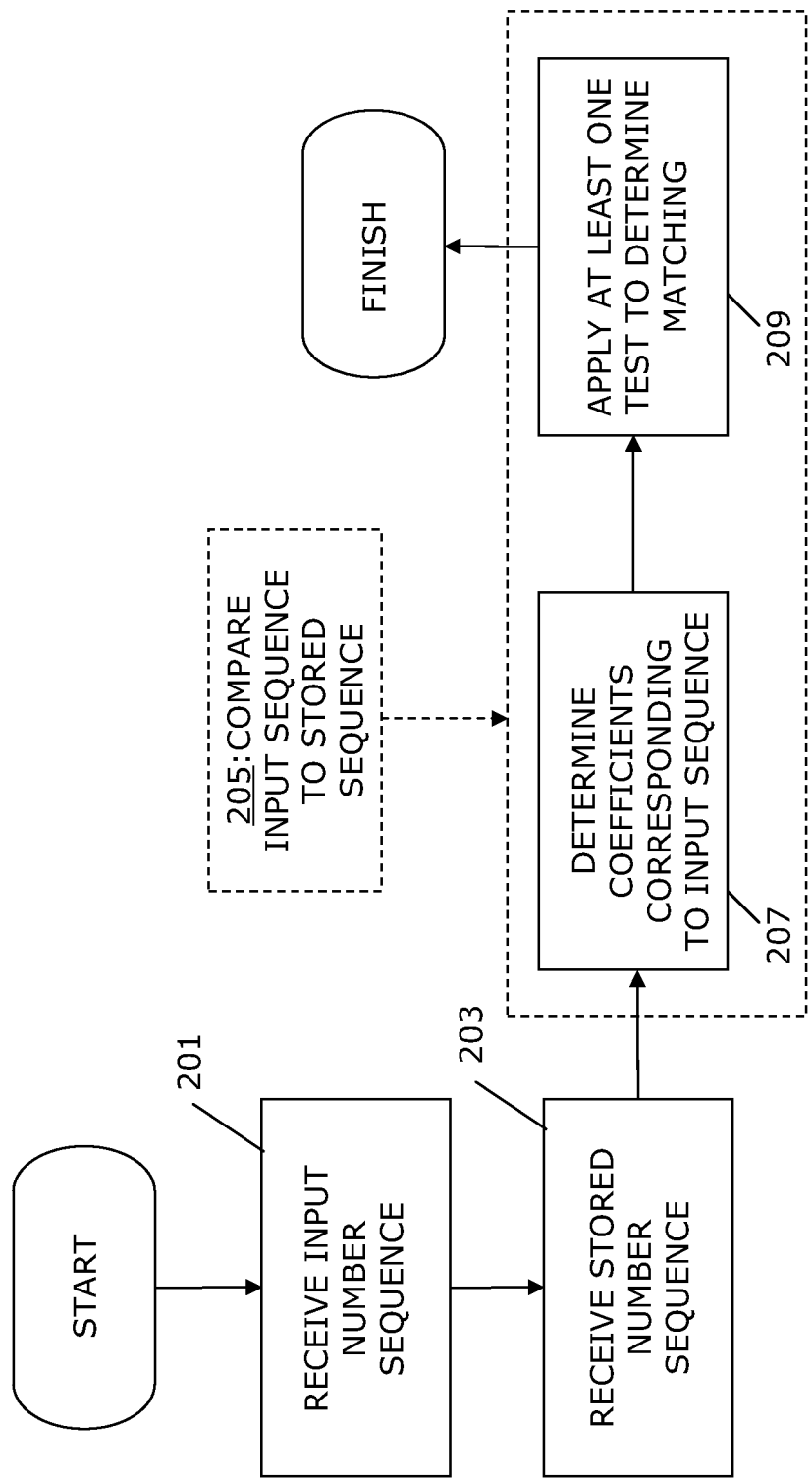
FIG. 2 sets forth a process more generally for providing a compressed representation of a number sequence.

FIG. 2 sets forth a process more generally for providing a compressed representation of a number sequence, in accordance with at least one embodiment of the invention. It should be appreciated that a process such as that broadly illustrated in FIG. 2 can be carried out on essentially any suitable computer system or set of computer systems, which may, by way of an illustrative and non-restrictive example, include a system such as that indicated at 12' in FIG. 3. In accordance with an example embodiment, most if not all of the process steps discussed with respect to FIG. 2 can be performed by way of a processing unit or units and system memory such as those indicated, respectively, at 16' and 28' in FIG. 3.

As shown in FIG. 2, in accordance with at least one embodiment of the invention, an input number sequence is received (201), as is a stored number sequence (203). The input number sequence is compared to the stored number sequence (205). The comparing includes determining a set of coefficients corresponding to the input number sequence, via solving at least one algebraic equation, the at least one algebraic equation comprising at least one of: an arithmetic equation, and an exponential equation (207). The comparing further includes applying at least one test to determine whether the set of coefficients identifies at least a portion of the stored number sequence as matching the entire input number sequence (209).

Figure 3:
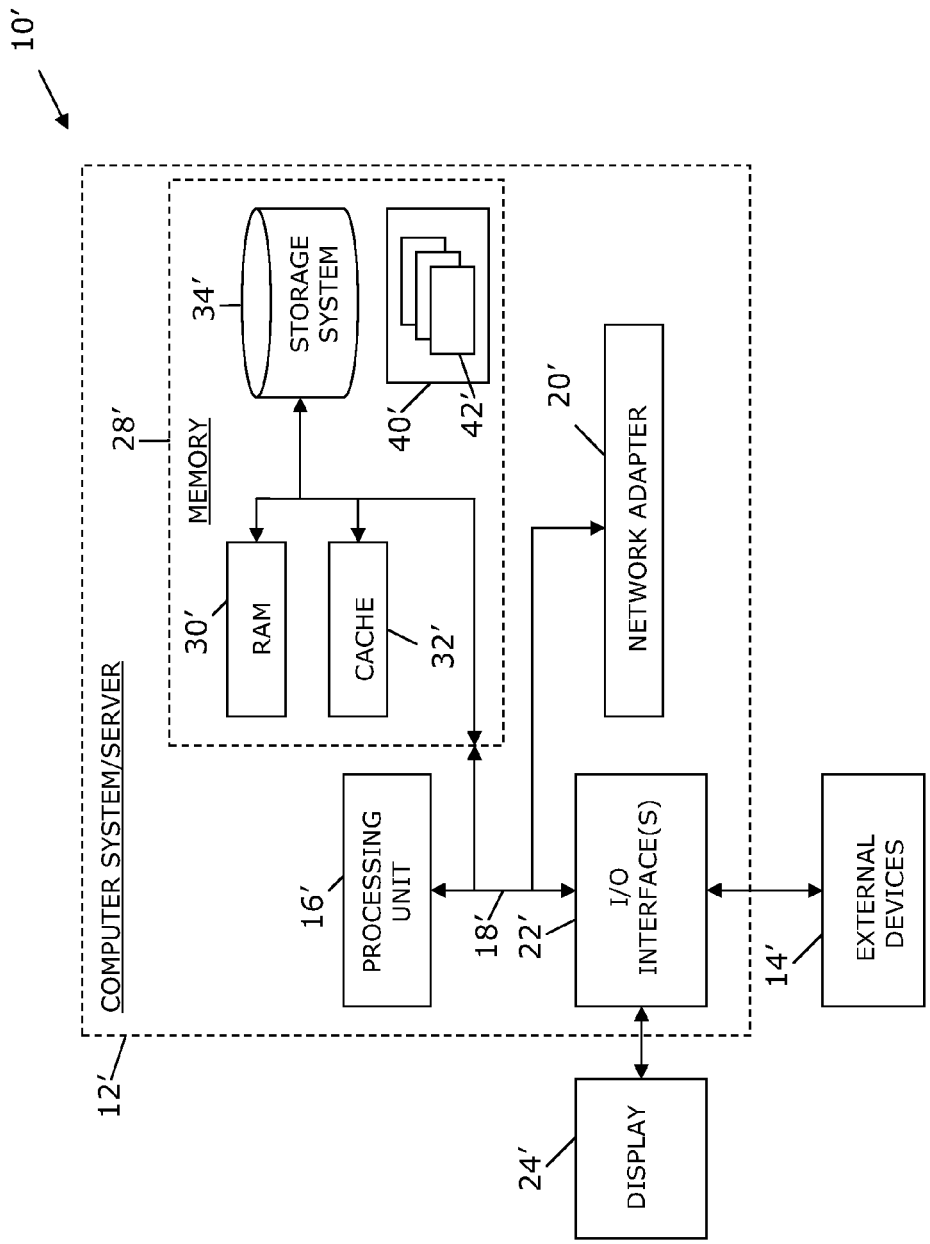
FIG. 3 illustrates a computer system.

Referring now to FIG. 3, a schematic of an example of a cloud computing node is shown. Cloud computing node 10' is only one example of a suitable cloud computing node and is not intended to suggest any limitation as to the scope of use or functionality of embodiments of the invention described herein. Regardless, cloud computing node 10' is capable of being implemented and/or performing any of the functionality set forth hereinabove. In accordance with embodiments of the invention, computing node 10' may not necessarily even be part of a cloud network but instead could be part of another type of distributed or other network, or could represent a stand-alone node. For the purposes of discussion and illustration, however, node 10' is variously referred to herein as a "cloud computing node".

In cloud computing node 10' there is a computer system/server 12', which is operational with numerous other general purpose or special purpose computing system environments or configurations. Examples of well-known computing systems, environments, and/or configurations that may be suitable for use with computer system/server 12' include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12' may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12' may be practiced in distributed cloud computing environments where tasks are performed by remote processing devices that are linked through a communications network. In a distributed cloud computing environment, program modules may be located in both local and remote computer system storage media including memory storage devices.

As shown in FIG. 3, computer system/server 12' in cloud computing node 10 is shown in the form of a general-purpose computing device. The components of computer system/server 12' may include, but are not limited to, at least one processor or processing unit 16', a system memory 28', and a bus 18' that couples various system components including system memory 28' to processor 16'.

Bus 18' represents at least one of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12' typically includes a variety of computer system readable media. Such media may be any available media that are accessible by computer system/server 12', and includes both volatile and non-volatile media, removable and non-removable media.

System memory 28' can include computer system readable media in the form of volatile memory, such as random access memory (RAM) 30' and/or cache memory 32'. Computer system/server 12' may further include other removable/non-removable, volatile/non-volatile computer system storage media. By way of example only, storage system 34' can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18' by at least one data media interface. As will be further depicted and described below, memory 28' may include at least one program product having a set (e.g., at least one) of program modules that are configured to carry out the functions of embodiments of the invention.

Program/utility 40', having a set (at least one) of program modules 42', may be stored in memory 28' (by way of example, and not limitation), as well as an operating system, at least one application program, other program modules, and program data. Each of the operating systems, at least one application program, other program modules, and program data or some combination thereof, may include an implementation of a networking environment. Program modules 42' generally carry out the functions and/or methodologies of embodiments of the invention as described herein.

Computer system/server 12' may also communicate with at least one external device 14' such as a keyboard, a pointing device, a display 24', etc.; at least one device that enables a user to interact with computer system/server 12; and/or any devices (e.g., network card, modem, etc.) that enable computer system/server 12' to communicate with at least one other computing device. Such communication can occur via I/O interfaces 22'. Still yet, computer system/server 12' can communicate with at least one network such as a local area network (LAN), a general wide area network (WAN), and/or a public network (e.g., the Internet) via network adapter 20'. As depicted, network adapter 20' communicates with the other components of computer system/server 12' via bus 18'. It should be understood that although not shown, other hardware and/or software components could be used in conjunction with computer system/server 12'. Examples include, but are not limited to: microcode, device drivers, redundant processing units, external disk drive arrays, RAID systems, tape drives, and data archival storage systems, etc.

It should be noted that aspects of the invention may be embodied as a system, method or computer program product. Accordingly, aspects of the invention may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the invention may take the form of a computer program product embodied in at least one computer readable medium having computer readable program code embodied thereon.

Any combination of one or more computer readable media may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having at least one wire, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store, a program for use by, or in connection with, an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wire line, optical fiber cable, RF, etc., or any suitable combination of the foregoing.

Computer program code for carrying out operations for aspects of the invention may be written in any combination of at least one programming language, including an object oriented programming language such as Java®, Smalltalk, C++ or the like and conventional procedural programming languages, such as the "C" programming language or similar programming languages. The program code may execute entirely on the user's computer (device), partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the invention are described herein with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture. Such an article of manufacture can include instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

This disclosure has been presented for purposes of illustration and description but is not intended to be exhaustive or limiting. Many modifications and variations will be apparent to those of ordinary skill in the art. The embodiments were chosen and described in order to explain principles and practical application, and to enable others of ordinary skill in the art to understand the disclosure.

Although illustrative embodiments of the invention have been described herein with reference to the accompanying drawings, it is to be understood that the embodiments of the invention are not limited to those precise embodiments, and that various other changes and modifications may be affected therein by one skilled in the art without departing from the scope or spirit of the disclosure.

What is claimed is:

1. A method of providing a compressed representation of a number sequence, said method comprising:
   utilizing a processor to execute computer code configured to perform the steps of:
   receiving an input number sequence representing an atomic service having a predetermined duration, wherein the input number sequence comprises a plurality of elements, wherein a number of the plurality of elements corresponds to a number of units of time within the predetermined duration represented as an array;
   determining a set of coefficients describing the input number sequence, via solving at least one algebraic equation, the at least one algebraic equation comprising at least one of: an arithmetic equation, and an exponential equation;
   accessing a library of stored number sequences, the number sequences comprising at least one of: arithmetic number sequences, and exponential number sequences;
   determining a representation of the stored number sequences;
   ascertaining a match of the set of coefficients with respect to the representation of the stored number sequences, wherein the ascertaining a match is performed by partitioning the representation of the stored number sequences into equivalence sets by performing a linear transformation test, a constant multiple test, a constant multiple of a product test, and a constant multiple of sum test on the input number sequence to reduce a number of stored number sequences to be considered when ascertaining a match and increasing a speed for ascertaining a match;
   the ascertaining a match comprising:
      determining, by performing the linear transformation test, whether the input number sequence is at least one of: a linear transformation of at least one of the representation of the stored number sequences and a log-linear transformation of at least one of the representation of the stored number sequences by applying a linear or log-linear transformation to a random position of the stored number sequence and comparing the result of the linear or log-linear transformation to a corresponding position of the input number sequence, wherein a match comprises a representation of the stored number sequence passing the linear transformation test;
      determining, by performing the constant multiple test, whether the input number sequence comprises a constant multiple of at least one of the representation of the stored number sequences, wherein a match comprises a representation of the stored number sequence passing the constant multiple test;
      determining, by performing the constant multiple of a product test, whether the input number sequence comprises a constant multiple of a product of at least one representation of the stored number sequences, wherein a match comprises a representation of the stored number sequence passing the constant multiple of a product test;
      determining, by performing the constant multiple of a sum test, whether the input number sequence comprises a constant multiple of a sum of at least one representation of the stored number sequences, wherein a match comprises a representation of the stored number sequence passing the constant multiple of a sum test; and
   iteratively performing the ascertaining a match for each of the representation of the stored number sequences until a match is found, the match representing a stored number sequence that corresponds to at least a portion of a specialized predictive cost model for the atomic service and providing the at least a portion of a specialized predictive cost model to a user; and
   in the event a match is not found, adding the input number sequence to the library of stored number sequences.

2. The method according to claim 1, wherein said ascertaining comprises mathematically comparing the set of coefficients to the representation of stored number sequences.

3. The method according to claim 2, wherein said determining of a set of coefficients comprises determining a compressed representative sequence pattern for the input number sequence.

4. The method according to claim 1, wherein said ascertaining comprises applying at least one test to determine whether the set of coefficients identifies at least a portion of a stored number sequence as matching the entire input number sequence.

5. The method according to claim 4, wherein:
   said accessing comprises accessing a first library; and
   said method comprises, in response to a failed matching test with respect to the first library:
   accessing a second library of stored number sequences; and
   testing whether the input number sequence matches a representation of the stored number sequences of the second library.

6. The method according to claim 5, wherein said testing comprises applying a linear equivalence test.

7. The method according to claim 5, comprising adding the input number sequence to the second library in response to a failed matching test with respect to the second library.

8. The method according to claim 1, wherein said determining of a set of coefficients comprises determining a set of coefficients with respect to at least one predetermined position in the input number sequence.

9. The method according to claim 8, wherein:
   the at least one predetermined position comprises at least one initial position; and
   said using of the set of coefficients comprises applying at least one test to the at least one initial position.

10. The method according to claim 9, wherein:
    the at least one predetermined position comprises at least one random position different from the at least one initial position; and
    said ascertaining comprises applying at least one test to the at least one random position.

11. The method according to claim 10, wherein said ascertaining comprises applying at least one test to all remaining positions in the input sequence in response to a successful matching test with respect to the at least one random position.

12. The method according to claim 1, wherein said ascertaining comprises at least one of:
    testing whether at least one element of the input number sequence is a constant multiple of at least one of: an arithmetic pattern, and an exponential pattern;
    testing whether at least one element of the input number sequence is a constant multiple of a product of an arithmetic pattern and an exponential pattern; and testing whether at least one element of the input number sequence is a constant multiple of a sum of an arithmetic pattern and an exponential pattern.

13. The method according to claim 12, wherein said ascertaining comprises all of:
said testing of whether at least one element of the input number sequence is a constant multiple of at least one of: an arithmetic pattern, and an exponential pattern;
said testing of whether at least one element of the input number sequence is a constant multiple of a product of an arithmetic pattern and an exponential pattern; and
said testing of whether at least one element of the input number sequence is a constant multiple of a sum of an arithmetic pattern and an exponential pattern.

14. The method according to claim 12, wherein said ascertaining comprises, in sequence:
said testing of whether at least one element of the input number sequence is a constant multiple of at least one of: an arithmetic pattern, and an exponential pattern;
thereafter performing said testing of whether at least one element of the input number sequence is a constant multiple of a product of an arithmetic pattern and an exponential pattern; and
thereafter performing said testing of whether at least one element of the input number sequence is a constant multiple of a sum of an arithmetic pattern and an exponential pattern.

15. An apparatus providing a compressed representation of a number sequence, said apparatus comprising:
at least one processor; and
a computer readable storage medium having computer readable program code embodied therewith and executable by the at least one processor, the computer readable program code comprising:
computer readable program code configured to receive an input number sequence representing an atomic service having a predetermined duration, wherein the input number sequence comprises a plurality of elements, wherein a number of the plurality of elements corresponds to a number of units of time within the predetermined duration represented as an array;
computer readable program code configured to determine a set of coefficients describing the input number sequence, via solving at least one algebraic equation, the at least one algebraic equation comprising at least one of: an arithmetic equation, and an exponential equation;
computer readable program code configured to access a library of stored number sequences, the number sequences comprising at least one of: arithmetic number sequences, and exponential number sequences;
computer readable program code configured to determine a representation of the stored number sequences;
computer readable program code configured to ascertain a match of the set of coefficients with respect to the representation of the stored number sequences, wherein the ascertaining a match is performed by partitioning the representation of the stored number sequences into equivalence sets by performing a linear transformation test, a constant multiple test, a constant multiple of a product test, and a constant multiple of sum test on the input number sequence to reduce a number of stored number sequences to be considered when ascertaining a match and increasing a speed for ascertaining a match;
the ascertaining a match comprising:
determining, by performing a linear transformation test, whether the input number sequence is at least one of: a linear transformation of at least one of the representation of the stored number sequences and a log-linear transformation of at least one of the representation of the stored number sequences by applying a linear or log-linear transformation to a random position of the stored number sequence and comparing the result of the linear or log-linear transformation to a corresponding position of the input number sequence, wherein a match comprises a representation of the stored number sequence passing the linear transformation test;
determining, by performing a constant multiple test, whether the input number sequence comprises a constant multiple of at least one of the representation of the stored number sequences, wherein a match comprises a representation of the stored number sequence passing the constant multiple test;
determining, by performing a constant multiple of a product test, whether the input number sequence comprises a constant multiple of a product of at least one representation of the stored number sequences, wherein a match comprises a representation of the stored number sequence passing the constant multiple of a product test;
determining, by performing a constant multiple of a sum test, whether the input number sequence comprises a constant multiple of a sum of at least one representation of the stored number sequences, wherein a match comprises a representation of the stored number sequence passing the constant multiple of a sum test; and
computer readable program code configured to iteratively perform the ascertaining a match for each of the representation of the stored number sequences until a match is found, the match representing a stored number sequence that corresponds to at least a portion of a specialized predictive cost model for the atomic service and providing the at least a portion of a specialized predictive cost model to a user; and
in the event a match is not found, computer readable program code configured to add the input number sequence to the library of stored number sequences.

16. A computer program product for providing a compressed representation of a number sequence, said computer program product comprising:
a non-transitory computer readable storage medium having computer readable program code embodied therewith, the computer readable program code comprising:
computer readable program code configured to receive an input number sequence representing an atomic service having a predetermined duration, wherein the input number sequence comprises a plurality of elements, wherein a number of the plurality of elements corresponds to a number of units of time within the predetermined duration represented as an array;
computer readable program code configured to determine a set of coefficients describing the input number sequence, via solving at least one algebraic equation, the at least one algebraic equation comprising at least one of: an arithmetic equation, and an exponential equation;
computer readable program code configured to access a library of stored number sequences, the number sequences comprising at least one of: arithmetic number sequences, and exponential number sequences;
computer readable program code configured to determine a representation of the stored number sequences;
computer readable program code configured to ascertain a match of the set of coefficients with respect to the representation of the stored number sequences, wherein the ascertaining a match is performed by partitioning the representation of the stored number sequences into equivalence sets by performing a linear transformation test, a constant multiple test, a constant multiple of a product test, and a constant multiple of sum test on the input number sequence to reduce a number of stored number sequences to be considered when ascertaining a match and increasing a speed for ascertaining a match;
the ascertaining a match comprising:
determining, by performing a linear transformation test, whether the input number sequence is at least one of: a linear transformation of at least one of the representation of the stored number sequences and a log-linear transformation of at least one of the representation of the stored number sequences by applying a linear or log-linear transformation to a random position of the stored number sequence and comparing the result of the linear or log-linear transformation to a corresponding position of the input number sequence, wherein a match comprises a representation of the stored number sequence passing the linear transformation test;
determining, by performing a constant multiple test, whether the input number sequence comprises a constant multiple of at least one of the representation of the stored number sequences, wherein a match comprises a representation of the stored number sequence passing the constant multiple test;
determining, by performing a constant multiple of a product test, whether the input number sequence comprises a constant multiple of a product of at least one representation of the stored number sequences, wherein a match comprises a representation of the stored number sequence passing the constant multiple of a product test;
determining, by performing a constant multiple of a sum test, whether the input number sequence comprises a constant multiple of a sum of at least one representation of the stored number sequences, wherein a match comprises a representation of the stored number sequence passing the constant multiple of a sum test; and
computer readable program code configured to iteratively perform the ascertaining a match for each of the representation of the stored number sequences until a match is found, the match representing a stored number sequence that corresponds to at least a portion of a specialized predictive cost model for the atomic service and providing the at least a portion of a specialized predictive cost model to a user; and
in the event a match is not found, computer readable program code configured to add the input number sequence to the library of stored number sequence.

17. The computer program product according to claim 16, wherein said computer readable program code is configured to mathematically compare the set of coefficients to the representation of stored number sequences.

18. A method of finding a succinct representation for an input sequence of numbers, said method comprising:

maintaining a first library of arithmetic and exponential sequences;
receiving an input number sequence, the input number sequence including a plurality of positions and values associated with the positions;
comparing the input number sequence with sequences from the first library;
said comparing comprising:
computing a set of coefficients with respect to values at given positions in the input sequence, via solving at least one algebraic equation selected from the group consisting of:
an arithmetic equation,
an exponential equation,
a sum of an arithmetic equation and an exponential equation,
a product of an arithmetic equation and an exponential equation,
a product of two arithmetic equations, and
a sum of two exponential equations; and
testing whether the set of coefficients describes a sequence set that matches the entire input sequence, wherein the sequence set includes a sequence or combination of sequences from the first library, wherein the testing is performed by partitioning the sequences from the first library into equivalence sets by performing a linear transformation test, a constant multiple test, a constant multiple of a product test, and a constant multiple of sum test on the input number sequence to reduce a number of sequences from the first library to be considered when ascertaining a match and increasing a speed for ascertaining a match;
the testing comprising:
determining, by performing a linear transformation test, whether the input sequence is at least one of: a linear transformation of at least one of the sequences from the first library and a log-linear transformation of at least one of the representation of the sequences from the first library by applying a linear or log-linear transformation to a random position of the sequences from the first library and comparing the result of the linear or log-linear transformation to a corresponding position of the input sequence, wherein a match comprises a sequence from the first library passing the linear transformation test;
determining, by performing a constant multiple test, whether the input sequence comprises a constant multiple of at least one of the sequences from the first library, wherein a match comprises a sequence from the first library passing the constant multiple test;
determining, by performing a constant multiple of a product test, whether the input sequence comprises a constant multiple of a product of at least one sequence from the first library, wherein a match comprises a sequence from the first library passing the constant multiple of a product test;
determining, by performing a constant multiple of a sum test, whether the input sequence comprises a constant multiple of a sum of at least one sequence from the first library, wherein a match comprises a sequence from the first library passing the constant multiple of a sum test; and
iteratively performing the testing for each of the sequences from the first library until a match is found, the match representing a stored number sequence that corresponds to at least a portion of a specialized predictive cost model for the atomic service and providing the at least a portion of a specialized predictive cost model to a user; and in the event a match is not found, adding the input sequence to the first library.

19. The method according to claim 18, wherein:

said testing comprises performing a test on a random position outside of the given set of positions with respect to which the coefficients are computed;

said method comprises, in response to a successful test on the random position, thereafter performing the test on all remaining positions of the input number sequence.

20. The method according to claim 18, comprising:

maintaining a second library of sequences; and ascertaining whether the input number sequence matches, via linear equivalence, a sequence in the second library.

21. The method according to claim 20, comprising, in response to finding no match in the first library or second library, adding the input sequence to the second library.

* * * * *